United States Patent
Cho et al.

(10) Patent No.: US 8,530,323 B2
(45) Date of Patent: Sep. 10, 2013

(54) CAPACITOR AND METHOD FOR FABRICATING THE SAME

(75) Inventors: Jin-Youn Cho, Cheongju-si (KR); Young-Soo Kang, Cheongju-si (KR); Jong-Il Kim, Cheongju-si (KR); Sang-Geun Koo, Cheongju-si (KR)

(73) Assignee: Magnachip Semiconductor, Ltd., Cheongju-si ( * ) Notice: Subject to any disclaimer, the term of this patent is extended or adjusted under 35 U.S.C. 154(b) by 0 days.

(21) Appl. No.: 13/415,947

(22) Filed: Mar. 9, 2012

(65) Prior Publication Data

US 2012/0171840 A1 Jul. 5, 2012

Related U.S. Application Data

(62) Division of application No. 12/603,124, filed on Oct. 21, 2009, now Pat. No. 8,159,046.

(30) Foreign Application Priority Data

Dec. 24, 2008 (KR) .................. 10-2008-0133890

(51) Int. Cl.
*H01L 21/02* (2006.01)

(52) U.S. Cl.
USPC ........... 438/396; 438/393; 438/636; 438/253; 257/532; 257/533; 257/E21.011

(58) Field of Classification Search
USPC ......... 438/396, 393, 636, 253; 257/E21.011, 257/532, 533
See application file for complete search history.

(56) References Cited

U.S. PATENT DOCUMENTS

| | | | |
|---|---|---|---|
| 6,344,964 B1 | 2/2002 | Adler | |
| 6,452,779 B1 | 9/2002 | Adler | |
| 6,458,650 B1 * | 10/2002 | Huang et al. | 438/253 |
| 6,461,914 B1 | 10/2002 | Roberts et al. | |
| 6,657,247 B2 | 12/2003 | Yoshiyama et al. | |
| 7,301,752 B2 | 11/2007 | Coolbaugh et al. | |

(Continued)

FOREIGN PATENT DOCUMENTS

| | | |
|---|---|---|
| JP | 2002-353328 | 12/2002 |
| KR | 10-2004-0045695 | 6/2004 |

(Continued)

OTHER PUBLICATIONS

European Search Report issued on Nov. 18, 2010, in corresponding European Patent Application No. 09252370.3 (8 pages).
Korean Office Action issued on Sep. 1, 2011, in counterpart Korean Patent Application No. 10-2008-0133890 (5 pages).
Korean Office Action issued on Aug. 19, 2010, in corresponding Korean Patent Application No. 10-2008-0133890 (6 pages).

*Primary Examiner* — Thinh T Nguyen
(74) *Attorney, Agent, or Firm* — NSIP Law

(57) ABSTRACT

A method for fabricating a capacitor is provided. The method for fabricating a capacitor includes forming a dielectric layer over a lower electrode on a substrate, forming an upper electrode over the dielectric layer, forming a hard mask over the upper electrode, etching the hard mask to form a hard mask pattern, etching the upper electrode to make the dielectric layer remain on the lower electrode in a predetermined thickness, forming an isolation layer along an upper surface of the remaining dielectric layer and the hard mask pattern, leaving the isolation layer having a shape of a spacer on one sidewall of the hard mask pattern, the upper electrode, and the dielectric layer, and etching the lower electrode to be isolated.

26 Claims, 13 Drawing Sheets

(56) References Cited

U.S. PATENT DOCUMENTS

2002/0179951 A1   12/2002   Yoshiyama et al.
2003/0008467 A1*   1/2003   Kai et al. .................... 438/393
2004/0169211 A1   9/2004   Zhung et al.

FOREIGN PATENT DOCUMENTS

| KR | 10-2006-0114056 | 11/2006 |
| KR | 10-2007-0028392 | 3/2007 |
| KR | 10-2007-0098318 | 10/2007 |

* cited by examiner

US 8,530,323 B2

CAPACITOR AND METHOD FOR FABRICATING THE SAME

CROSS-REFERENCE TO RELATED APPLICATIONS

This application is a Division of pending U.S. application Ser. No. 12/603,124, filed on Oct. 21, 2009, which claims the benefit under 35 U.S.C. §119(a) of Korean Patent Application No. 10-2008-0133890 filed on Dec. 24, 2008, in the Korean Intellectual Property Office, the entire disclosure of which is incorporated herein by reference for all purposes.

BACKGROUND OF THE INVENTION

1. Field

The following description relates to semiconductor fabrication technology; and, for example, to a metal-insulator-metal (MIM) capacitor and a method for fabricating the same.

2. Description of Related Art

An MIM capacitor is used in an analog circuit and a radio frequency (RF) circuit. The MIM capacitor is used when a capacitor of a high quality factor Q having a low serial resistance is needed. Furthermore, the MIM capacitor is used on behalf of analog capacitors due to its low thermal budget and low power voltage and low parasitic capacitance.

FIGS. 1A to 1E are cross-sectional views illustrating a conventional method for fabricating an MIM capacitor.

As shown in FIG. 1A, a lower metal line 102 is formed on a substrate 101. A lower electrode 103, a dielectric layer 104, and an upper electrode 105 are sequentially formed on the lower metal line 102.

Referring to FIG. 1B, the upper electrode 105 is etched to form an upper electrode pattern 105A, and the dielectric layer 104 is also partially etched to form a first dielectric layer pattern 104A. Here, the first dielectric layer pattern 104A remains on the lower electrode 103 in a predetermined thickness.

Referring to FIG. 1C, the remaining first dielectric layer pattern 104A is etched to form a second dielectric layer pattern 104B.

Referring to FIG. 1D, the lower electrode 103 and the lower metal line 102 are sequentially etched to form a lower electrode pattern 103A and a lower metal line pattern 102A.

Referring to FIG. 1E, by performing a line process after forming an inter-layer insulation layer 106, first and second vias 107 and 108 are formed inside the inter-layer insulation layer 106, and an upper metal line 111 is formed thereon. The upper metal line 111 is a stack layer of first and second layers 109 and 110.

In the conventional method of fabricating the MIM capacitor, due to polymer or various kinds of conductive residues, the upper electrode pattern 105A is not electrically isolated from the lower electrode pattern 103A or the lower metal line pattern 102A, which functions as a part of the lower electrode pattern 103A. As a result, they may be shorted and, consequently, a leakage current may be generated.

SUMMARY

In one general aspect, there is provided a method for fabricating a capacitor, the method including forming a dielectric layer over a lower electrode on a substrate, forming an upper electrode over the dielectric layer, forming a hard mask over the upper electrode, etching the hard mask to form a hard mask pattern, etching the upper electrode to make the dielectric layer remain on the lower electrode in a predetermined thickness, forming an isolation layer along an upper surface of the remaining dielectric layer and the hard mask pattern, leaving the isolation layer having a shape of a spacer on one sidewall of the hard mask pattern, the upper electrode, and the dielectric layer, and etching the lower electrode to be isolated.

A general aspect of the method may further provide that the leaving of the isolation layer includes forming a predetermined portion of the dielectric layer to extend to a lower side of the isolation layer.

A general aspect of the method may further provide that the forming of the predetermined portion includes aligning the extended portion of the dielectric layer with one side of the isolation layer.

A general aspect of the method may further provide that the extended portion of the dielectric layer has a uniform thickness within variation ranging from approximately 10 Å to approximately 20 Å in a wafer.

A general aspect of the method may further provide that a thickness of the extended portion of the dielectric layer is less than a thickness of a portion of the dielectric layer between the upper electrode and the lower electrode.

A general aspect of the method may further provide that the extended portion of the dielectric layer has a thickness ranging from approximately 30 Å to approximately 100 Å.

A general aspect of the method may further provide that the etching of the hard mask is performed by using a photoresist pattern as an etch mask.

A general aspect of the method may further provide removing the photoresist pattern after the forming of the hard mask.

A general aspect of the method may further provide performing a clean process after the removing of the photoresist pattern.

A general aspect of the method may further provide that the etching of the upper electrode is performed by a main etch process and an over-etch process, the main etch process having a duration that is greater by a predetermined amount than a duration of the over-etch process.

A general aspect of the method may further provide that the main etch process is performed for approximately 100 seconds to approximately 130 seconds. A general aspect of the method may further provide that the over-etch process is performed for approximately 20 seconds to approximately 30 seconds.

A general aspect of the method may further provide that the main etch process is performed by using chlorine (Cl) gas and nitrogen ($N_2$) gas.

A general aspect of the method may further provide that the over-etch process is performed by using boron trichloride ($BCl_3$) gas and argon (Ar) gas.

A general aspect of the method may further provide that the main etch process is performed until the dielectric layer remains on the lower electrode in a predetermined thickness.

A general aspect of the method may further provide that the hard mask pattern is formed of an oxide layer or a nitride layer.

A general aspect of the method may further provide that the isolation layer is formed of an oxide layer or a nitride layer.

A general aspect of the method may further provide that during the leaving of the isolation layer, an etch-back process or a blanket process is performed.

A general aspect of the method may further provide forming an inter-layer insulation layer to cover the upper electrode and the substrate after the etching the lower electrode to be isolated, etching the inter-layer insulation layer and the hard mask pattern to form first and second holes to partially expose the lower electrode and the upper electrode, forming first and second vias to fill the first and second holes, and forming a plurality of upper metal lines, each coupled to the first and second vias.

A general aspect of the method may further provide that each of the upper and lower electrodes is selected from the group consisting of ruthenium (Ru), strontium ruthenate (SrRuO$_3$), platinum (Pt), tantalum nitride (TaN), tungsten nitride (WN), titanium nitride (TiN), titanium aluminum nitride (TiAlN), cobalt (Co), copper (Cu), hafnium (Hf), and a combination thereof.

A general aspect of the method may further provide that the dielectric layer is selected from the group consisting of silicon nitride (SiN), silicon oxide (SiO$_2$), aluminum oxide (Al$_2$O$_3$), hafnium oxide (HfO), tantalum oxide (Ta$_2$O$_5$), strontium titanate (SrTiO$_3$), Perofskite (CaTiO$_3$), lanthanum aluminate (LaAlO$_3$), barium zirconia (BaZrO$_3$), barium zircon titanate (BaZrTiO$_3$), strontium zircon titanate (SrZrTiO$_3$), and a combination thereof.

A general aspect of the method may further provide that the leaving of the isolation layer includes separating the isolation layer from the lower electrode using the dielectric layer.

A general aspect of the method may further provide that, in the etching of the hard mask, a fluorocarbon gas is used as a main gas, and a gas selected from the group consisting of oxygen (O$_2$) gas, nitrogen (N$_2$) gas, and argon (Ar) gas is used as a supplementary gas.

A general aspect of the method may further provide that the fluorocarbon gas is selected from the group consisting of Perfluoromethane (CF$_4$), Trifluoromethane (CHF$_3$), Hexafluoroethane (C$_2$F$_6$), Octafluoroethane (C$_2$F$_8$), Octafluorocyclobutane (C$_4$F$_8$), and a combination thereof.

A general aspect of the method may further provide that, in the etching of the upper electrode, a chlorine-based gas is used as a main gas, and a gas selected from the group consisting of nitrogen gas and argon gas is used as a supplementary gas.

A general aspect of the method may further provide that the chlorine-based gas is selected from the group consisting of chlorine (Cl$_2$), Boron Trichloride (BCl$_3$), carbon chloride (CCl), hydrochloride (HCl), chlorotrifluoromethane (CF$_3$Cl), tetraclorosilane (SiCl$_4$), and a combination thereof.

Other features and aspects may be apparent from the following detailed description, the drawings, and the claims.

Figure 1A:
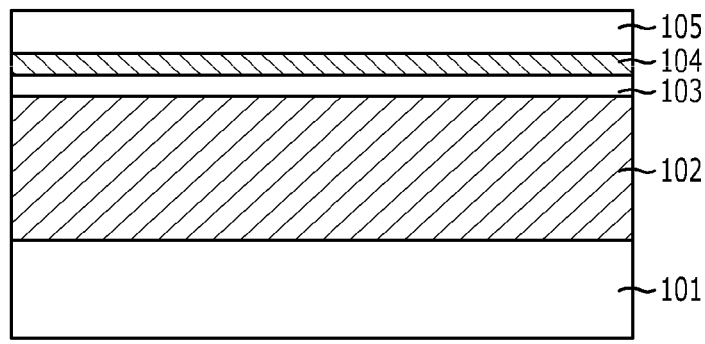
FIGS. 1A to 1E are cross-sectional views illustrating a conventional method for fabricating an MIM capacitor.
Figure 1B:
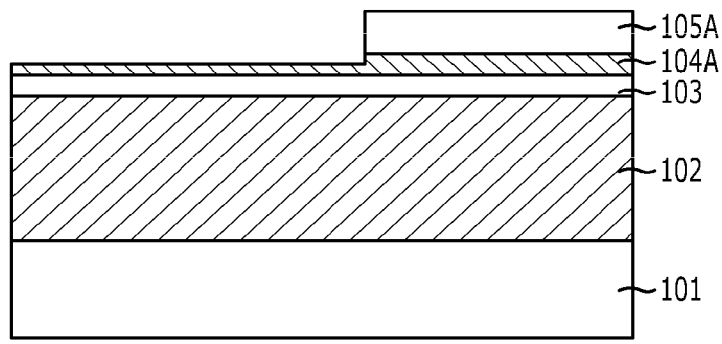
Figure 1C:
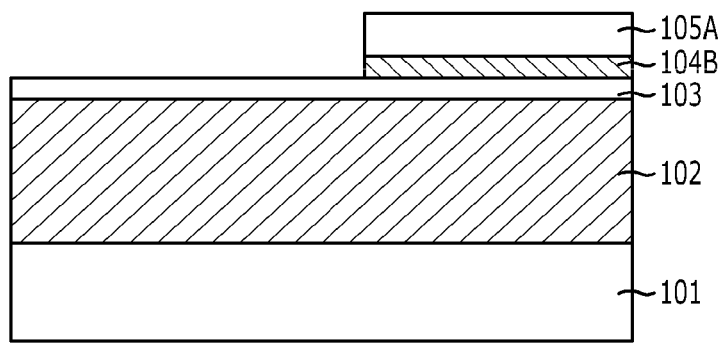
Figure 1D:
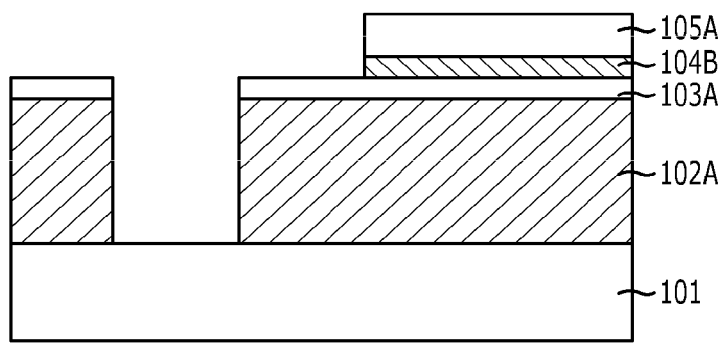
Figure 1E:
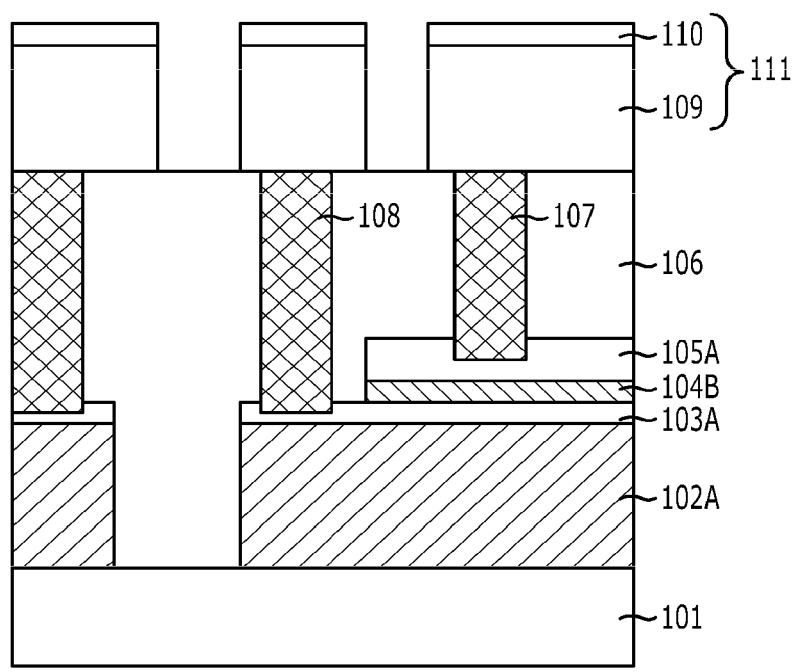

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is understood that the features of the present disclosure may be embodied in different forms and should not be construed as limited to the example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s).

It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Furthermore, it will also be understood that when each reference numeral includes an English character, it can mean that the same layer is partially changed through an etch process, a polish process and the like.

First Example Embodiment

FIGS. 2A to 2D are cross-sectional views illustrating an example of a method for fabricating an MIM capacitor in accordance with a first example embodiment.

Figure 2A:
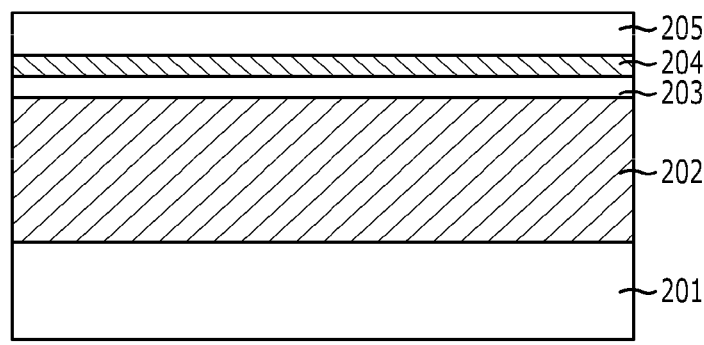
FIGS. 2A to 2D are cross-sectional views illustrating an example of a method for fabricating an MIM capacitor in accordance with a first example embodiment.

Referring to FIG. 2A, a lower metal line 202 is formed on a substrate 201. Here, the lower metal line 202 is selected from the group consisting of a transition metal. The lower metal line 202 may be formed of any metal among aluminum (Al), copper (Cu), and platinum (Pt). The thickness of the lower metal line 202 may vary according to a specific resistance Rs required for a line process of a corresponding layer.

Subsequently, a lower electrode 203 is formed over the lower metal line 202. The lower electrode 203 includes antireflection materials and may be selected from the group consisting of ruthenium (Ru), strontium ruthenate (SrRuO$_3$), platinum (Pt), tantalum nitride (TaN), tungsten nitride (WN), titanium nitride (TiN), titanium aluminum nitride (TiAlN), cobalt (Co), copper (Cu), hafnium (Hf), and a combination thereof.

Subsequently, a dielectric layer 204 is formed over the lower electrode 203. The dielectric layer 204 includes insulation materials and may be selected from the group consisting of silicon nitride (SiN), silicon oxide (SiO$_2$), aluminum oxide (Al$_2$O$_3$), hafnium oxide (HfO), tantalum oxide (Ta$_2$O$_5$), strontium titanate (SrTiO$_3$), Perofskite (CaTiO$_3$), lanthanum aluminate (LaAlO$_3$), barium zirconia (BaZrO$_3$), barium zircon titanate (BaZrTiO$_3$), strontium zircon titanate (SrZrTiO$_3$), and a combination thereof.

Subsequently, an upper electrode 205 is formed over the dielectric layer 204. The upper electrode 205 may be formed of substantially the same materials as the lower electrode 203. For example, the upper electrode 205 may be selected from the group consisting of Ru, SrRuO$_3$, Pt, TaN, WN, TiN, TiAlN, Co, Cu, Hf, and a combination thereof.

Figure 2B:
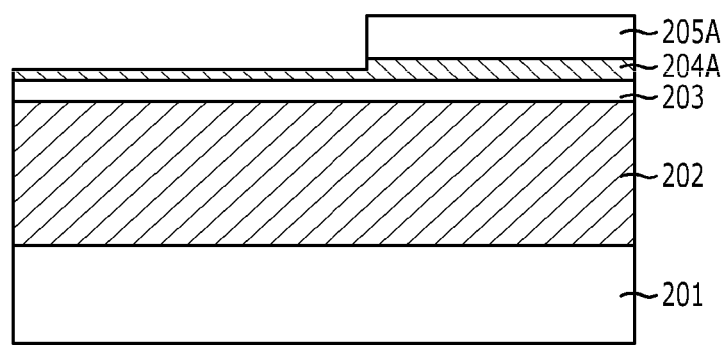

Referring to FIG. 2B, the upper electrode 205 is etched to form an upper electrode pattern 205A. Herein, an over-etch process is performed. That is, through the etch process, the upper electrode 205 is etched to form the upper electrode pattern 205A, and, at the same time, the dielectric layer 204 is also partially etched to form a first dielectric layer pattern 204A remaining on the lower electrode 203. The etch process may use chlorine-based gas as a main gas, and a gas selected from the group consisting of nitrogen (N$_2$) gas and argon (Ar) gas as a supplementary gas. The chlorine-based gas may be selected from the group consisting of chlorine (Cl$_2$), Boron Trichloride (BCl$_3$), carbon chloride (CCl), hydrochloride (HCl), chlorotrifluoromethane (CF$_3$Cl), tetraclorosilane (SiCl$_4$), and a combination thereof.

Figure 2C:
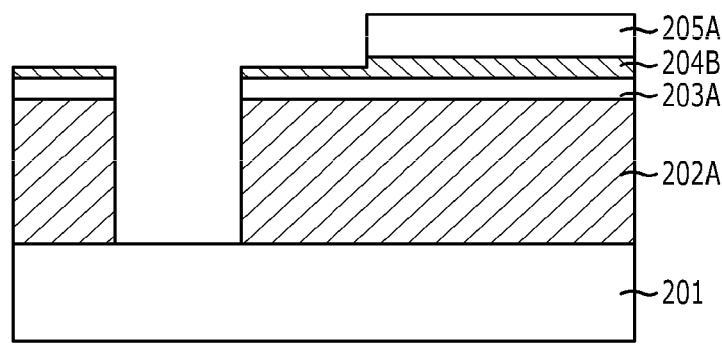

Referring to FIG. 2C, the remaining first dielectric layer pattern 204A, the lower electrode 203 and the lower metal line 202 are sequentially etched to form a second dielectric layer pattern 204B, a lower electrode pattern 203A, and a lower metal line pattern 202A partially exposing a surface of the substrate 201. Accordingly, a desired profile of the MIM capacitor may be formed as shown in FIG. 2C.

Figure 2D:
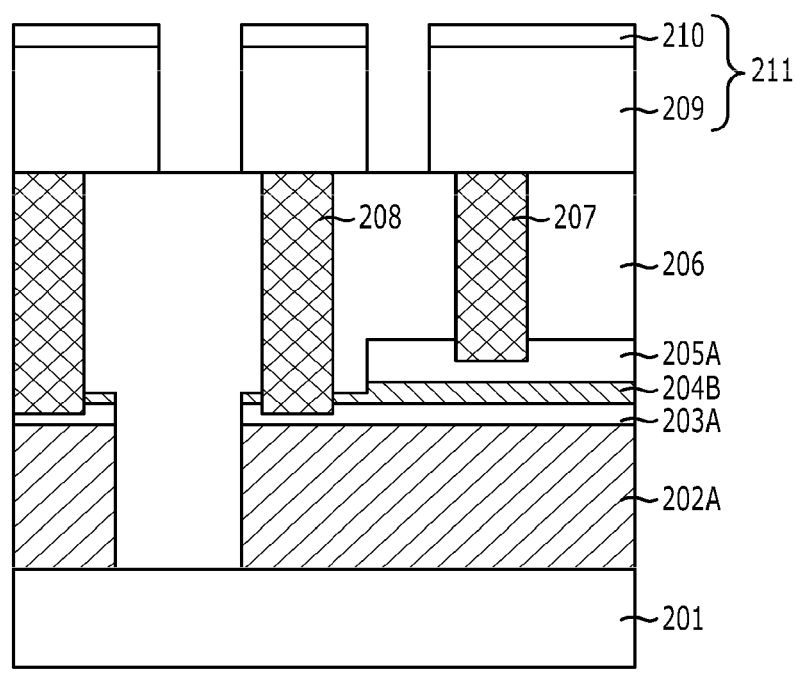

Referring to FIG. 2D, a line process is performed as follows. After forming an inter-layer insulation layer 206 over the substrate 201 and the MIM capacitor, the lower electrode pattern 203A and the upper electrode pattern 205A are partially exposed to thereby form first and second holes (not shown). Thereafter, first and second vias 207 and 208 are formed to fill the first and second holes. Then, a plurality of upper metal lines 211 are formed thereon to be electrically coupled with the first and second vias 207 and 208.

Each of the upper metal lines 211 includes a first conductive layer 209, which may substantially function as a metal line, and a second conductive layer 210 formed over the first conductive layer 209. The first conductive layer 209 is selected from the group consisting of a transition metal. The first conductive layer 209 may be formed of any metal among aluminum (Al), copper (Cu), and platinum (Pt). The second conductive layer 210 may be selected from the group consisting of Ru, SrRuO$_3$, Pt, TaN, WN, TiN, TiAlN, Co, Cu, Hf, and a combination thereof.

According to the teachings above, there is provided a method for fabricating the MIM capacitor in accordance with the first embodiment, in which the lower electrode pattern 203A is electrically isolated from the upper electrode pattern 205A by leaving a predetermined thickness of the second dielectric layer pattern 204B over the lower electrode pattern 203A, as shown in FIG. 2C, which may server to prevent a short between the lower electrode pattern 203A and the upper electrode pattern 205A due to various residues generated during plural fabricating processes.

Figure 3:
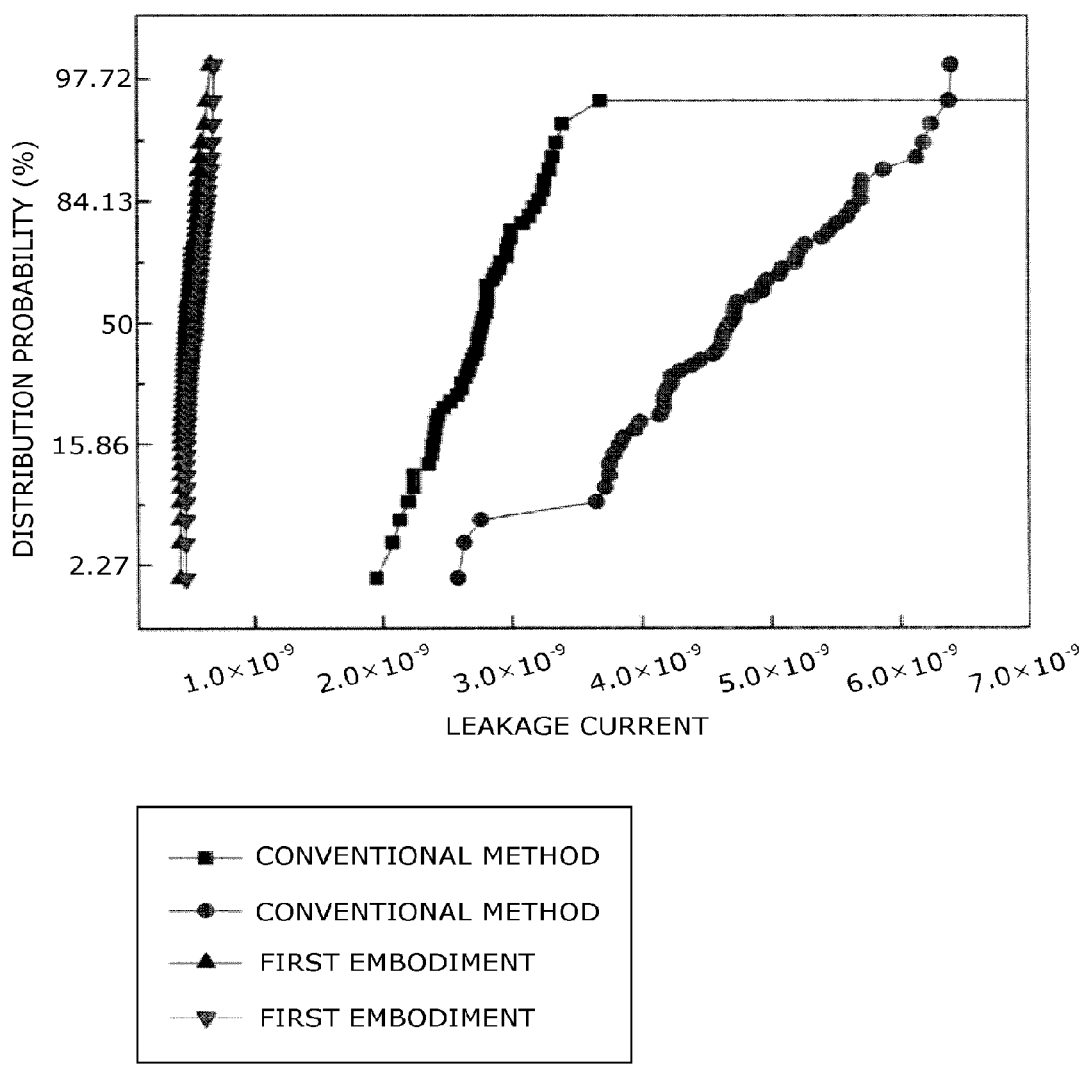
FIG. 3 is a graph illustrating an example of comparison results of a leakage current in accordance with the first example embodiment and the conventional method.

FIG. 3 is a graph illustrating an example of comparison results of a leakage current in accordance with the first example embodiment and the conventional method.

As shown in FIG. 3, a characteristic of the leakage current of the MIM capacitor in accordance with the first example embodiment is better than that of the conventional method.

In the first example embodiment, the predetermined thickness of the second dielectric layer pattern 204B remains over the lower electrode pattern 203A as shown in FIG. 2C. In case that the dielectric layer is formed of metal oxide materials having a high dielectric constant such as aluminum oxide (Al$_2$O$_3$), hafnium oxide (HfO), tantalum oxide (Ta$_2$O$_5$), the remaining dielectric layer may affect a subsequent process.

Figure 4:
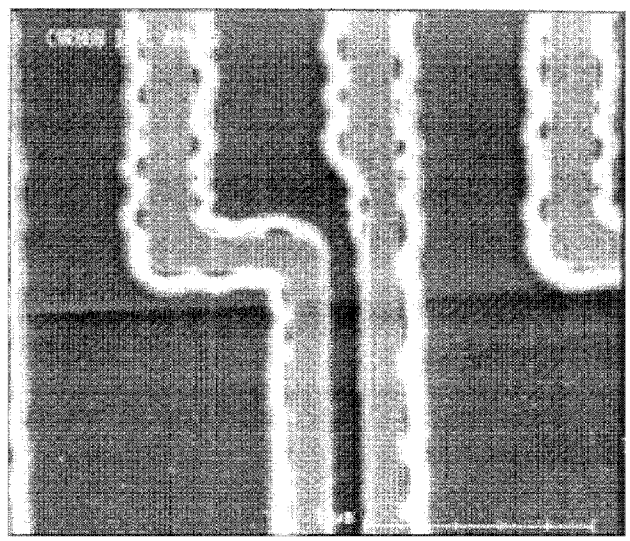
FIG. 4 is a plan view illustrating an example of a metal line fabricated in accordance with the first example embodiment.

FIG. 4 is a plan view illustrating an example of a metal line fabricated in accordance with the first example embodiment.

As shown in FIG. 4, when the dielectric layer remains over the lower electrode, it requires an additional etch process to the dielectric layer. Accordingly, a margin of a photoresist is insufficient, and a profile of the metal line has a poor characteristic due to a conductive polymer.

Figure 5:
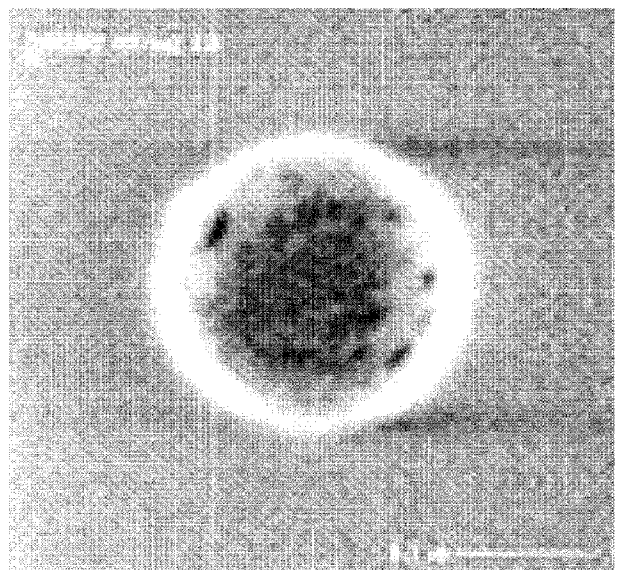
FIG. 5 is a plan view illustrating an example of a via fabricated in accordance with the first example embodiment.

FIG. 5 is a plan view illustrating an example of a via fabricated in accordance with the first example embodiment.

As shown in FIG. 5, when the dielectric layer remains over the lower electrode, the conductive polymer remains inside the via during an etch process for forming the via where the metal line is formed. If the conductive polymer remains inside the via, a resistance of via contacts is increased so that a device characteristic is deteriorated.

Figure 6:
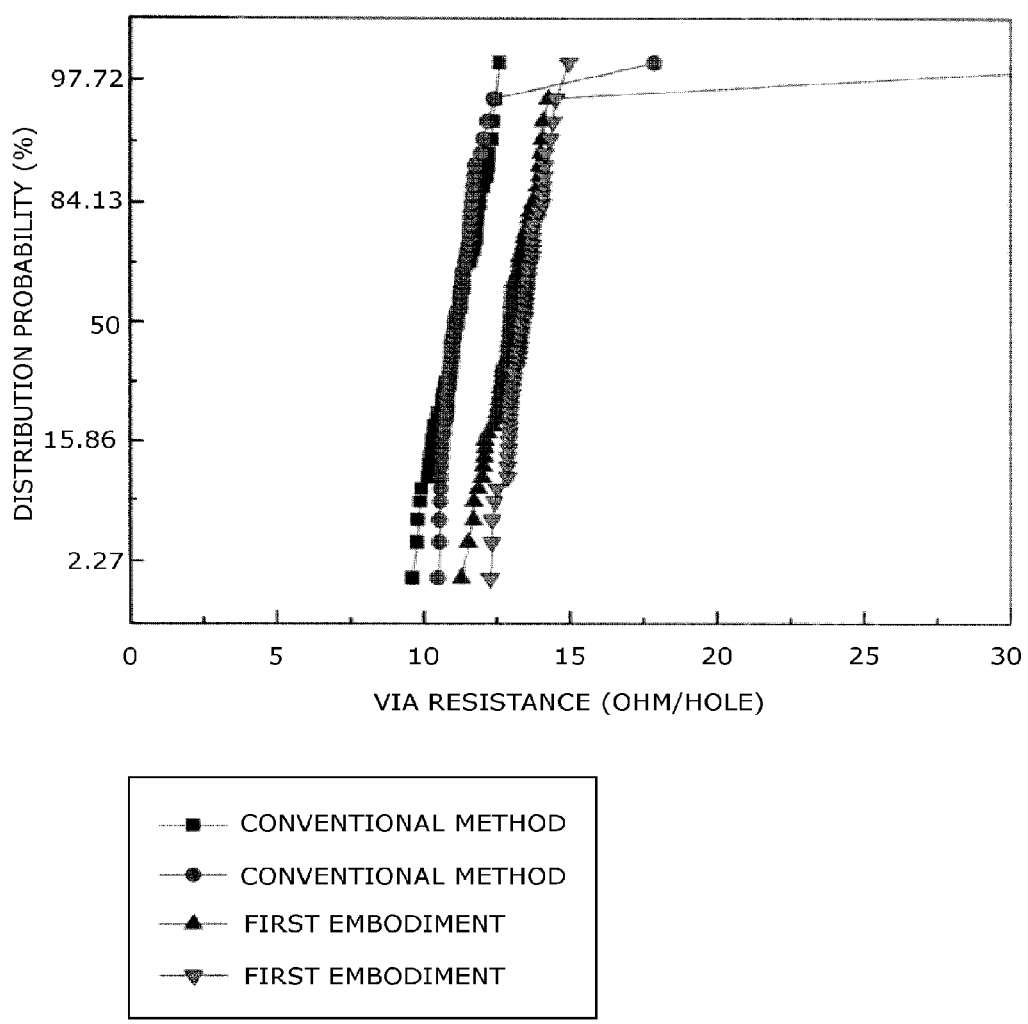
FIG. 6 is a graph illustrating an example of comparison results of a resistance of via contacts in accordance with the first example embodiment and the conventional method.

FIG. 6 is a graph illustrating an example of comparison results of a resistance of via contacts in accordance with the first example embodiment and the conventional method.

As shown in FIG. 6, the resistance of via contacts in accordance with the first example embodiment is increased in comparison with the conventional method. That is, when the dielectric layer remains over the lower electrode, the resistance of the via contact becomes increased.

Second Example Embodiment

FIGS. 7A to 7F are cross-sectional views illustrating an example a method for fabricating an MIM capacitor in accordance with a second example embodiment.

Figure 7A:
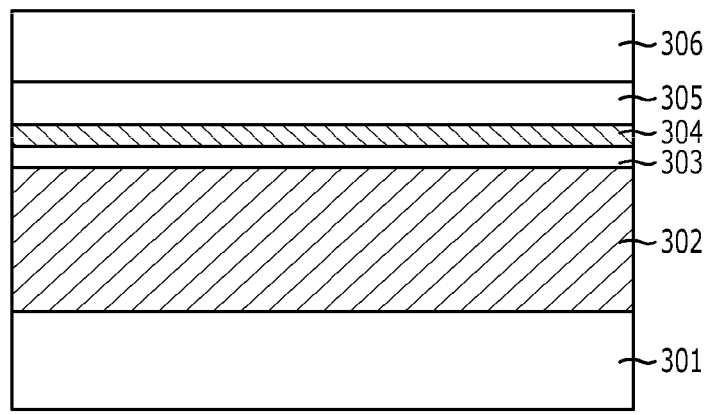
FIGS. 7A to 7F are cross-sectional views illustrating an example of a method for fabricating an MIM capacitor in accordance with a second example embodiment.

Referring to FIG. 7A, a lower metal line 302 is formed on a substrate 301. A lower electrode 303, a dielectric layer 304 and an upper electrode 305 are sequentially formed over the lower metal line 302.

Subsequently, a hard mask 306 is formed over the upper electrode 305. The hard mask 306 may be formed of an oxide layer such as undoped silicate glass (USG), tetraethyl orthosilicate (TEOS) and high density plasma (HDP), or a nitride layer such as silicon nitride (SiN) or silicon oxynitride (SiON) through a low pressure chemical vapor deposition (LPCVD) process. The hard mask 306 is formed with a thickness ranging from approximately 100 Å to approximately 4000 Å.

Figure 7B:
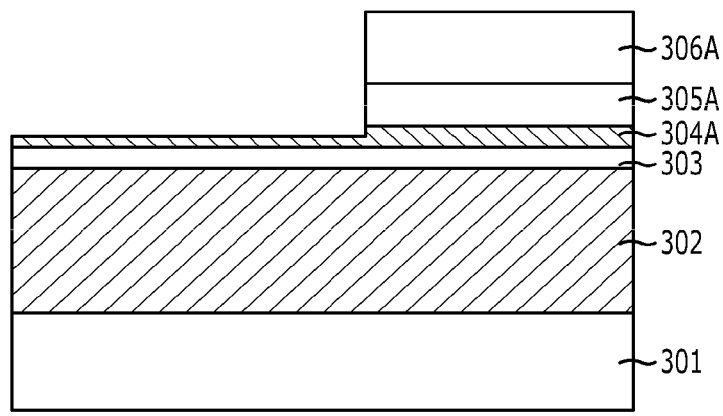

Referring to FIG. 7B, a photoresist pattern (not shown) is formed over the hard mask 306. An etch process is performed to etch the hard mask 306 by using the photoresist pattern as an etch mask to thereby form a hard mask pattern 306A. Here, the etch process uses a fluorocarbon gas as a main gas, and a gas selected from the group consisting of oxygen (O$_2$) gas, nitrogen (N$_2$) gas and argon (Ar) gas as a supplementary gas. The fluorocarbon gas may be selected from the group consisting of Perfluoromethane (CF$_4$), Trifluoromethane (CHF$_3$), Hexafluoroethane (C$_2$F$_6$), Octafluoroethane (C$_2$F$_8$), Octafluorocyclobutane (C$_4$F$_8$), and a combination thereof. After the hard mask pattern 306A is formed, the photoresist pattern is removed and a clean process may be performed thereon.

Subsequently, the upper electrode 305 is etched to form an upper electrode pattern 305A. Herein, the upper electrode 305 is etched by using the photoresist pattern as an etch mask, or using only the hard mask pattern 306A as an etch mask. The upper electrode 305 may be etched by using chlorine-based gas as a main gas, and a gas selected from the group consisting of nitrogen gas and argon gas as a supplementary gas. The chlorine-based gas may be selected from the group consisting of chlorine ($Cl_2$), Boron Trichloride ($BCl_3$), carbon chloride (CCl), hydrochloride (HCl), chlorotrifluoromethane ($CF_3Cl$), tetraclorosilane ($SiCl_4$), and a combination thereof.

When using only the hard mask pattern 306A as an etch mask, a strip process is performed to remove the photoresist pattern before etching the upper electrode 305. The strip process is performed by using $O_2$ plasma. The photoresist pattern is removed before etching the upper electrode 305 because the materials of the photoresist pattern function as sources generating the polymer.

Meanwhile, it is possible to remove the photoresist pattern after etching the upper electrode 305, not before etching the upper electrode 305. Herein, plural polymers may be generated around the upper electrode 305 during etching the upper electrode 305. Since the generated polymers are not removed during subsequent processes, a leakage current of the MIM capacitor may be caused. Accordingly, it is desirable that the photoresist pattern is removed before etching the upper electrode 305.

In another example embodiment, a two-step process may be performed to etch the upper electrode 305. The two-step process includes a main etch process and an over-etch process. The main etch process is performed for a predetermined time longer than that of the over-etch process. The main etch process may be performed for approximately 100 seconds to approximately 130 seconds, and the over-etch process is performed for approximately 20 seconds to approximately 30 seconds. The main etch process is performed by using chlorine (Cl) gas and nitrogen ($N_2$) gas, and the over-etch process is performed by using boron trichloride ($BCl_3$) gas and argon (Ar) gas. The main etch process may be performed until a predetermined thickness of the dielectric layer 304 remains to form a dielectric layer pattern 304A.

The two-step process is used to etch the upper electrode 305 in order to secure uniformity to the remaining thickness of the dielectric layer pattern 304A after etching the upper electrode 305. The dielectric layer pattern 304A may be formed of metal oxide materials having a high dielectric constant, i.e., a high permittivity layer. The high permittivity layer has a lower etch rate compared to a silicon oxide layer, thereby deteriorating etch uniformity.

During the main etch process for etching the upper electrode 305 using chlorine (Cl) gas and nitrogen ($N_2$) gas, an etch rate around a wafer is faster than that at the center of the wafer. On the contrary, during the main etch process for etching the dielectric layer pattern 304A exposed after etching the upper electrode 305, which is performed under the same conditions, an etch rate at the center of a wafer is faster than that around the wafer. During the over-etch process using boron trichloride ($BCl_3$) gas and argon (Ar) gas, an etch rate around the wafer is faster than that at the center of the wafer. As a result, the uniformity to the remaining thickness of the dielectric layer pattern 304A of the high permittivity layer is determined by combining the etch rates of those processes.

In the conventional method, an over-etch process is performed after finishing etching the upper electrode. On the contrary, in the present example embodiment, the main etch process is performed on the dielectric layer in advance. Then, the over-etch process is continuously performed thereon, thereby possibly improving the uniformity in the remaining thickness of the dielectric layer.

Figure 7C:
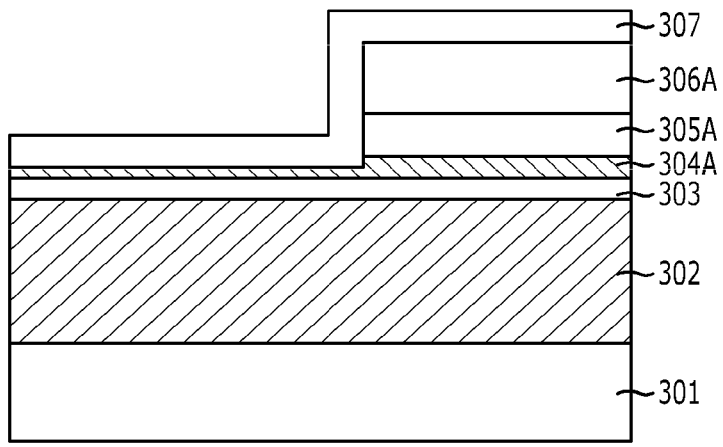
Figure 7D:
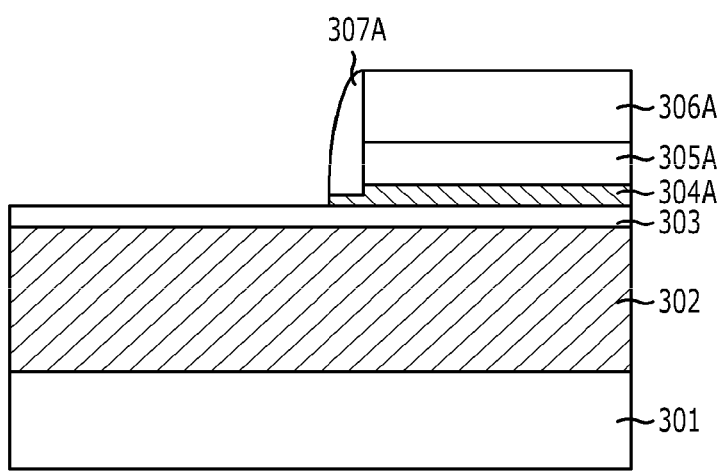

For reference, during the etching of the upper electrode 305, the dielectric layer pattern 304A remaining after the performing of the main etch process and the over-etch process includes a first thickness extended to a lower side of an isolation layer pattern having a shape of a spacer, which is shown as reference symbol 307A in FIG. 7D, and a second thickness between the upper electrode pattern 305A and the lower electrode 303. The first thickness is thinner than the second thickness. The first thickness may have an uniform thickness ranging from approximately 30Å to approximately 100 Å within variation ranging from approximately 10 Å to approximately 20 Å in the wafer.

Referring to FIG. 7C, an isolation layer 307 is formed along an upper surface of the remaining dielectric layer pattern 304A and the hard mask pattern 306A. The isolation layer 307 has an etch selectivity to the hard mask pattern 306A. For example, the isolation layer 307 is formed of a nitride layer when the hard mask pattern 306A is formed of an oxide layer, and the isolation layer 307 is formed of an oxide layer when the hard mask pattern 306A is formed of a nitride layer. Both the hard mask pattern 306A and the isolation layer 307 may be formed of a nitride layer, or both the hard mask pattern 306A and the isolation layer 307 may be formed of an oxide layer. Herein, the oxide layer includes USG, TEOS or HDP, and the nitride layer includes SiN or SiON. The isolation layer 307 is formed in a predetermined thickness ranging from approximately 100 Å to approximately 4000 Å.

Referring to FIG. 7D, the isolation layer 307 is etched to form an isolation layer pattern 307A remaining on one sidewall of the hard mask pattern 306A, the upper electrode pattern 305A, and the dielectric layer pattern 304A. Herein, the etch process is a dry etch process. The etch process may include an etch-back process or a blanket process. The etch process may be performed to etch the dielectric layer pattern 304A remaining over the lower electrode 303 shown in FIG. 7C. Accordingly, one side of the dielectric layer pattern 304A extended to a lower side of the isolation layer pattern 307A is aligned with one side of the isolation layer pattern 307A, which is an opposite side to the upper electrode pattern 305A.

Figure 7E:
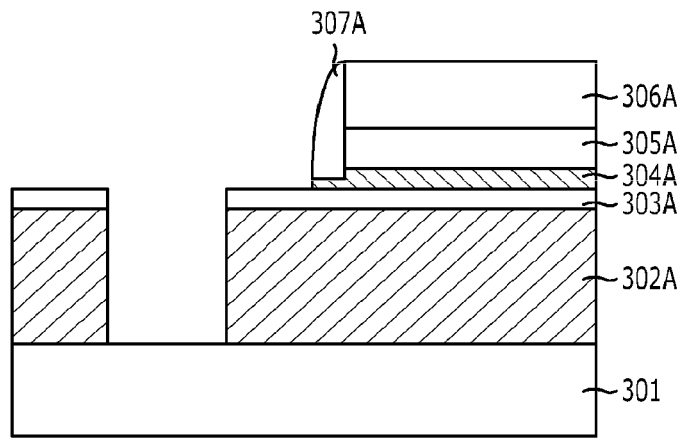

Referring to FIG. 7E, the lower electrode 303 and the lower metal line 302 are sequentially etched to form a lower electrode pattern 303A and a lower metal line pattern 302A partially exposing a surface of the substrate 301.

Figure 7F:
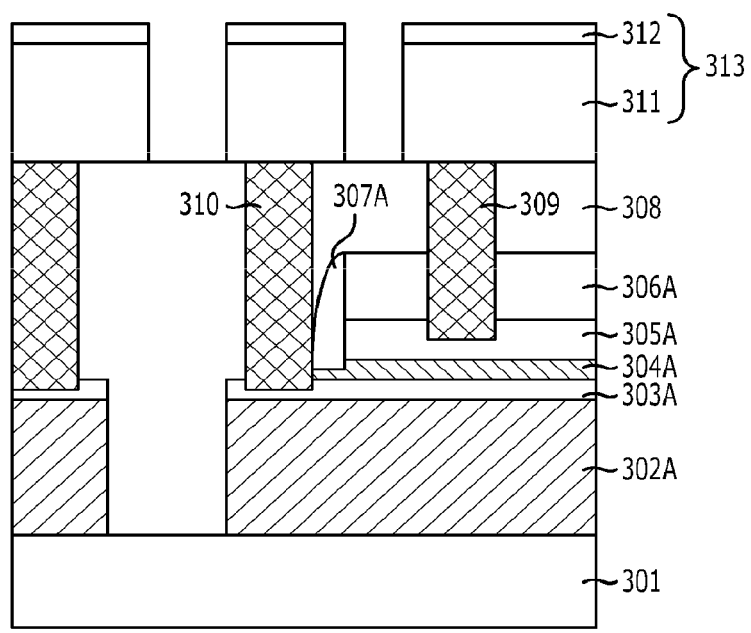

Referring to FIG. 7F, a line process is performed to sequentially form first and second interconnection metal lines 309 and 310, and a plurality of upper metal lines 313. The line process is performed as follows. First, after forming an interlayer insulation layer 308, the lower electrode pattern 303A and the upper electrode pattern 305A are partially exposed to thereby form first and second vias (not shown). Thereafter, the first and second interconnection metal lines 309 and 310 are formed to fill the first and second vias, and then the upper metal lines 313 are formed thereon to be electrically coupled with the first and interconnection metal lines 309 and 310.

Like the first example embodiment, the upper metal lines 313 include a first conductive layer 311, which may substantially function as a metal line, and a second conductive layer 312 formed over the first conductive layer 311. The first conductive layer 311 may be selected from the group consisting of a transition metal, and the second conductive layer 313 may be selected from the group consisting of Ru, $SrRuO_3$, Pt, TaN, WN, TiN, TiAlN, Co, Cu, Hf, and a combination thereof.

Figure 8:
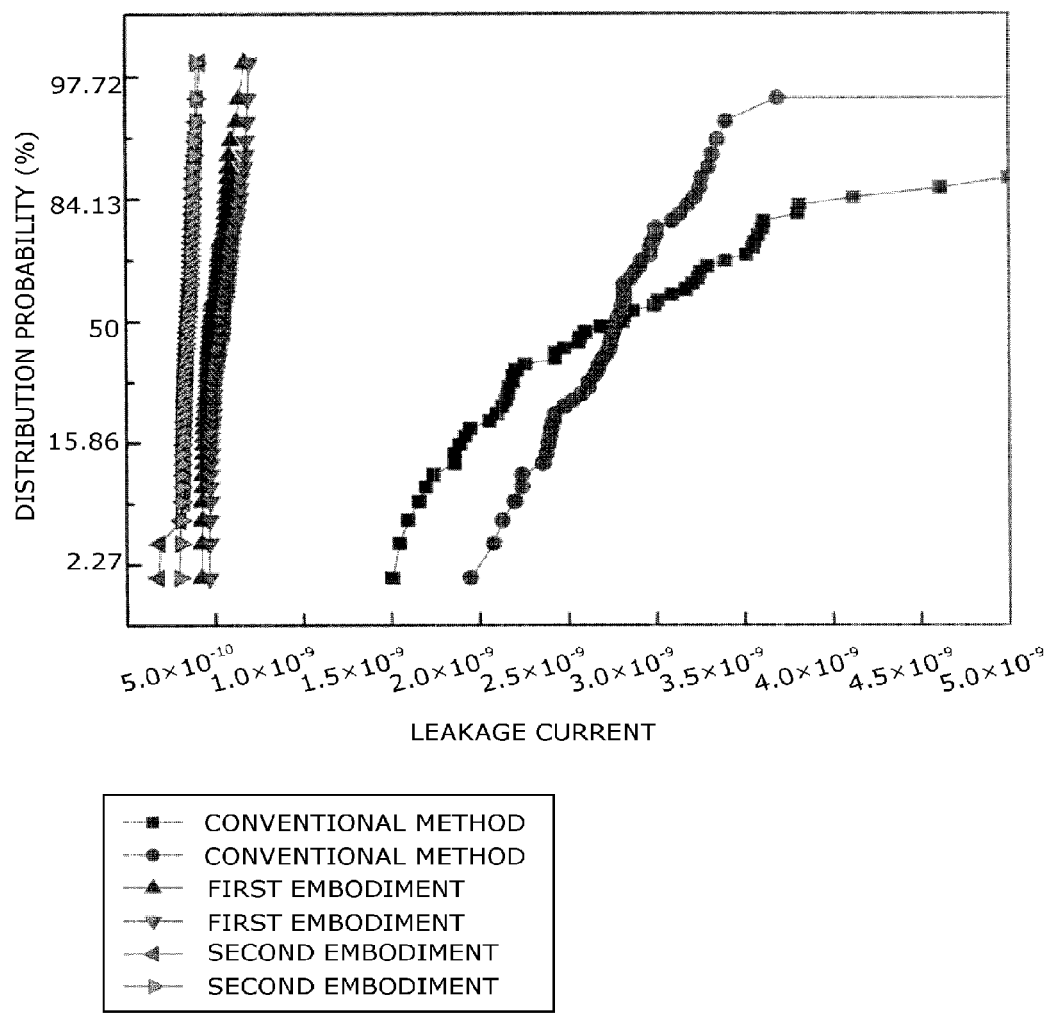
FIG. 8 is a graph illustrating an example of comparison results of a leakage current in accordance with the first and second example embodiments and the conventional method.

FIG. 8 is a graph illustrating an example of comparison results of a leakage current in accordance with the first and second example embodiments and the conventional method.

As shown in FIG. 8, like the first example embodiment, a characteristic of the leakage current of the MIM capacitor in accordance with the second example embodiment is improved.

Figure 9:
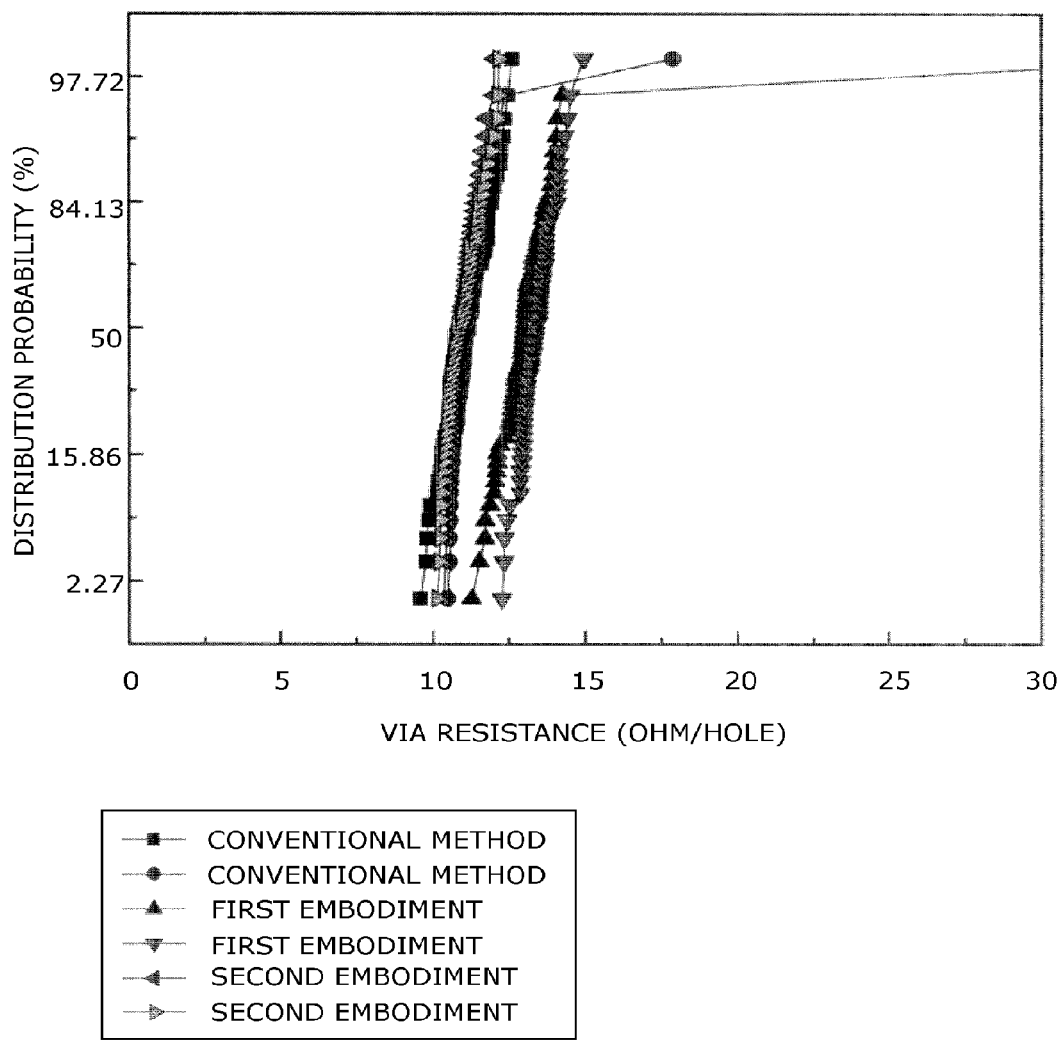
FIG. 9 is a graph illustrating an example of comparison results of a resistance of via contacts in accordance with the first and second example embodiments and the conventional method.

FIG. 9 is a graph illustrating comparison results of a resistance of via contacts in accordance with the first and second example embodiments of the present invention and the conventional method.

As shown in FIG. 9, the resistance of via contacts in accordance with the second example embodiment is improved in comparison with the first example embodiment and the conventional method.

The example embodiments may have the following effects.

First, an isolation layer may be formed with a shape of a spacer on one sidewall of an upper electrode and a dielectric to thereby electrically isolate the upper electrode and a lower electrode. Accordingly, a characteristic of a leakage current of an MIM capacitor may be improved by fundamentally preventing the upper electrode and the lower electrode from being short.

Second, a process for forming vias to connect an upper metal line and a lower electrode may be performed in a state that a predetermined portion of a dielectric layer remaining on the lower electrode, which does not overlap the upper metal line, is removed. Consequently, a resistance of via contacts caused by the remaining dielectric layer may be improved.

Third, a hard mask pattern may be formed on an upper electrode and an isolation layer having a shape of a spacer may be formed on one sidewall of the upper electrode to thereby entirely separate the upper electrode from the external environment. As a result, a leakage current characteristic of an MIM capacitor may be improved, and thus a reliability may be improved.

Fourth, an etch process to an upper electrode may be performed in a state that a photoresist pattern does not exist by removing the photoresist pattern prior to the etch process to the upper electrode after forming a hard mask pattern. As a result, it may be possible to prevent polymers from being generated by the photoresist pattern during the etching of the upper electrode.

Fifth, when performing an etch process to an upper electrode, a main etch process may be performed for a predetermined time longer than that of an over-etch process. Accordingly, after finishing the etch process to the upper electrode, a thickness of a dielectric layer remaining on a lower electrode may be uniformly maintained within variation range of approximately 20 Å in a wafer.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for fabricating a capacitor, the method comprising:
    forming a dielectric layer over a lower electrode on a substrate;
    forming an upper electrode over the dielectric layer;
    forming a hard mask over the upper electrode;
    etching the hard mask to form a hard mask pattern;
    etching the upper electrode to make the dielectric layer remain on the lower electrode in a predetermined thickness;
    forming an isolation layer along an upper surface of the remaining dielectric layer and the hard mask pattern;
    leaving a portion of the isolation layer having a shape of a spacer on one sidewall of the hard mask pattern, the upper electrode, and the dielectric layer; and
    etching the lower electrode to be isolated.

2. The method of claim 1, wherein the leaving of the portion of the isolation layer comprises forming a predetermined portion of the dielectric layer to extend to a lower side of the isolation layer.

3. The method of claim 2, wherein the forming of the predetermined portion comprises aligning the extended portion of the dielectric layer with one side of the isolation layer.

4. The method of claim 2, wherein the extended portion of the dielectric layer has a uniform thickness within variation ranging from approximately 10 Å to approximately 20 Å in a wafer.

5. The method of claim 2, wherein a thickness of the extended portion of the dielectric layer is less than a thickness of a portion of the dielectric layer between the upper electrode and the lower electrode.

6. The method of claim 2, wherein the extended portion of the dielectric layer has a thickness ranging from approximately 30 Å to approximately 100 Å.

7. The method of claim 1, wherein the etching of the hard mask is performed by using a photoresist pattern as an etch mask.

8. The method of claim 7, further comprising:
    removing the photoresist pattern after the forming of the hard mask.

9. The method of claim 8, further comprising:
    performing a clean process after the removing of the photoresist pattern.

10. The method of claim 1, wherein the etching of the upper electrode is performed by a main etch process and an over-etch process, the main etch process having a duration that is greater by a predetermined amount than a duration of the over-etch process.

11. The method of claim 10, wherein the main etch process is performed for approximately 100 seconds to approximately 130 seconds.

12. The method of claim 10, wherein the over-etch process is performed for approximately 20 seconds to approximately 30 seconds.

13. The method of claim 10, wherein the main etch process is performed by using chlorine (Cl) gas and nitrogen ($N_2$) gas.

14. The method of claim 10, wherein the over-etch process is performed by using boron trichloride ($BCl_3$) gas and argon (Ar) gas.

15. The method of claim 10, wherein the main etch process is performed until the dielectric layer remains on the lower electrode in a predetermined thickness.

16. The method of claim 1, wherein the hard mask pattern is formed of an oxide layer or a nitride layer.

17. The method of claim 1, wherein the isolation layer is formed of an oxide layer or a nitride layer.

18. The method of claim 1, wherein during the leaving of the isolation layer, an etch-back process or a blanket process is performed.

19. The method of claim 1, further comprising:
    forming an inter-layer insulation layer to cover the upper electrode and the substrate after the etching the lower electrode to be isolated;
    etching the inter-layer insulation layer and the hard mask pattern to form first and second holes to partially expose the lower electrode and the upper electrode;
    forming first and second vias to fill the first and second holes; and forming a plurality of upper metal lines, each coupled to the first and second vias.

20. The method of claim 1, wherein each of the upper and lower electrodes is selected from the group consisting of ruthenium (Ru), strontium ruthenate ($SrRuO_3$), platinum (Pt), tantalum nitride (TaN), tungsten nitride (WN), titanium nitride (TiN), titanium aluminum nitride (TiAlN), cobalt (Co), copper (Cu), hafnium (Hf), and a combination thereof.

21. The method of claim 1, wherein the dielectric layer is selected from the group consisting of silicon nitride (SiN), silicon oxide ($SiO_2$), aluminum oxide ($Al_2O_3$), hafnium oxide (HfO), tantalum oxide ($Ta_2O_5$), strontium titanate ($SrTiO_3$), Perofskite ($CaTiO_3$), lanthanum aluminate ($LaAlO_3$), barium zirconia ($BaZrO_3$), barium zircon titanate ($BaZrTiO_3$), strontium zircon titanate ($SrZrTiO_3$), and a combination thereof.

22. The method of claim 1, wherein the leaving of the isolation layer comprises separating the isolation layer from the lower electrode using the dielectric layer.

23. The method of claim 1, wherein, in the etching of the hard mask:
   a fluorocarbon gas is used as a main gas; and
   a gas selected from the group consisting of oxygen ($O_2$) gas, nitrogen ($N_2$) gas, and argon (Ar) gas is used as a supplementary gas.

24. The method of claim 23, wherein the fluorocarbon gas is selected from the group consisting of Perfluoromethane ($CF_4$), Trifluoromethane ($CHF_3$), Hexafluoroethane ($C_2F_6$), Octafluoroethane ($C_2F_8$), Octafluorocyclobutane ($C_4F_8$), and a combination thereof.

25. The method of claim 1, wherein, in the etching of the upper electrode:
   a chlorine-based gas is used as a main gas; and
   a gas selected from the group consisting of nitrogen gas and argon gas is used as a supplementary gas.

26. The method of claim 25, wherein the chlorine-based gas is selected from the group consisting of chlorine ($Cl_2$), Boron Trichloride ($BCl_3$), carbon chloride (CCl), hydrochloride (HCl), chlorotrifluoromethane ($CF_3Cl$), tetraclorosilane ($SiCl_4$), and a combination thereof.

* * * * *